(12) United States Patent
Hsu et al.

(10) Patent No.: US 9,608,126 B1
(45) Date of Patent: Mar. 28, 2017

(54) SEMICONDUCTOR DEVICE AND METHOD OF FABRICATING THE SAME

(71) Applicant: UNITED MICROELECTRONICS CORP., Hsin-Chu (TW)

(72) Inventors: Chia-Fu Hsu, Tainan (TW); Chun-Yuan Wu, Yun-Lin County (TW); Xu Yang Shen, Singapore (SG); Zhibiao Zhou, Singapore (SG); Qinggang Xing, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/953,036

(22) Filed: Nov. 27, 2015

(30) Foreign Application Priority Data

Sep. 29, 2015 (CN) .......................... 2015 1 0629471

(51) Int. Cl.
*H01L 29/78* (2006.01)
*H01L 29/786* (2006.01)
*H01L 29/66* (2006.01)

(52) U.S. Cl.
CPC .... *H01L 29/7869* (2013.01); *H01L 29/66969* (2013.01); *H01L 29/78696* (2013.01)

(58) Field of Classification Search
CPC ........... H01L 29/7869; H01L 29/66969; H01L 29/78696
See application file for complete search history.

(56) References Cited

U.S. PATENT DOCUMENTS

| 6,479,391 | B2 | 11/2002 | Morrow et al. |
| 6,545,753 | B2 | 4/2003 | Subramanian et al. |
| 6,984,580 | B2 | 1/2006 | Dostalik et al. |
| 8,933,444 | B2 | 1/2015 | Saito et al. |
| 8,981,359 | B2 | 3/2015 | Kum et al. |
| 2012/0051119 | A1* | 3/2012 | Yamazaki .......... G11C 16/0433 365/149 |
| 2015/0102332 | A1 | 4/2015 | Shin et al. |

* cited by examiner

*Primary Examiner* — Whitney T Moore
(74) *Attorney, Agent, or Firm* — Winston Hsu; Scott Margo (57) ABSTRACT

A semiconductor device and a method of fabricating the same, the semiconductor device includes a substrate, an interconnect structure, and an oxide semiconductor structure. The substrate has a first region and a second region. The interconnect structure is disposed on the substrate, in the first region. The oxide semiconductor structure is disposed over a hydrogen blocking layer, in the second region of the substrate.

18 Claims, 10 Drawing Sheets

SEMICONDUCTOR DEVICE AND METHOD OF FABRICATING THE SAME

BACKGROUND OF THE INVENTION

1. Field of the Invention

The present invention relates to a semiconductor device and a method for forming the same, and more particularly, to a semiconductor device having an oxide semiconductor structure and a method for forming the same.

2. Description of the Prior Art

In the modern society, the micro-processor systems comprising integrated circuits (IC) are ubiquitous devices, being utilized in diverse fields such as automatic control electronics, mobile communication devices and personal computers. With the development of technology and the increase of original applications for electronic products, the IC devices are becoming smaller, more delicate and more diversified.

In a wide variety of materials, indium oxide ($In_2O_3$), tin oxide ($SnO_2$) and zinc oxide (ZnO) are generally known transparent conductive oxides. Indium tin oxide (ITO), when being formed of a thin film, can be used as a transparent electrode in a flat panel display or a touch sensor of a capacitance type touch panel. Tin oxide and zinc oxide can be used in a transparent solar cell electrode. However, these materials are essentially semiconductor materials, and it is desired for the researchers to develop a semiconductor device by using their semiconductor material property, such as an oxide semiconductor transistor.

However, due to oxidation of the semiconductor material itself, when using of this oxide semiconductor material, it is easy to damage the oxide semiconductor layer during the production process, thus affecting the performance of the product. Therefore, for a semiconductor device having an oxide semiconductor material, there is still a need for a better design or a manufacturing method, thereto gain better quality.

SUMMARY OF THE INVENTION

The present invention therefore provides a semiconductor device having an oxide semiconductor structure and a method for forming the same, in order to gain a better product performance.

To achieve the purpose described above, the present invention provides a semiconductor device including a substrate, an interconnect structure and an oxide semiconductor structure. The substrate has a first region and a second region. The interconnect structure is disposed on the substrate, in the first region, wherein the interconnect structure includes a plug disposed in a dielectric layer on the substrate and a hydrogen blocking layer disposed on the plug. The oxide semiconductor structure is disposed over the hydrogen blocking layer, in the second region of the substrate, wherein the oxide semiconductor structure includes an oxide semiconductor layer, two source/drain structures and a first gate. The oxide semiconductor layer is disposed on a first insulating layer. The source/drain structures are disposed on the oxide semiconductor layer. The first gate is disposed between the source/drain structures, on the oxide semiconductor layer, wherein the first gate overlaps the oxide semiconductor layer.

To achieve the purpose described above, the present invention provides a method of forming a semiconductor device including following steps. First of all, a substrate having a first region and a second region is provided. Then, an interconnect structure is formed on the substrate, in the first region, wherein the interconnect structure includes a plug disposed in a dielectric layer on the substrate and a hydrogen blocking layer disposed on the plug. Next, an oxide semiconductor structure is formed over the hydrogen blocking layer, in the second region, wherein the oxide semiconductor structure includes an oxide semiconductor layer, two source/drain structures and a first gate. The oxide semiconductor layer is formed on a first insulating layer. The source/drain structures are formed on the oxide semiconductor layer. The first gate is formed between the source/drain structures, on the oxide semiconductor layer, wherein the first gate overlaps the oxide semiconductor layer.

According to the above, the semiconductor device and the forming method thereof in the present invention is at least characterized by disposing a multilayer structure of hydrogen blocking layers (including oxide metal) in the metal interconnect structure between a metal oxide semiconductor (MOS) transistor and an oxide semiconductor (OS) structure. The hydrogen blocking layer for example includes silicon oxynitride or earth metal oxide, like hafnium oxide, hafnium silicon oxide, hafnium silicon oxynitride, aluminum oxide, lanthanum oxide or hafnium zirconium oxide for example, and which is formed on each plug structure and damascene structure to block out-diffusion mist and hydrogen in the device, so as to avoid such out-diffusion mist and hydrogen flowing along the metal interconnect structure and affecting the device or the subsequent forming processes. Also, if the plug structure or the damascene structure includes a copper layer, an additional capping layer, like a silicon oxide layer, silicon nitride layer, a silicon oxynitride layer, or a silicon carbonitride layer for example, may be further disposed before the hydrogen blocking layer is formed, to further prevent copper from diffusing into periphery dielectric layer and to further improve the reliability of the device thereby.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 10 are schematic diagrams illustrating a method of forming a semiconductor device according to a first embodiment of the present invention, wherein:

DETAILED DESCRIPTION

To provide a better understanding of the presented invention, preferred embodiments will be described in detail. The preferred embodiments of the present invention are illustrated in the accompanying drawings with numbered elements.

Please refer to FIG. 1 to FIG. 10, showing schematic diagrams of the method of forming a semiconductor structure according to the first embodiment of the present invention. Firstly, a substrate 300 is provided, and which may be any component that can serve as a base for forming devices, like a semiconductor substrate for example, such as silicon substrate, epitaxial silicon substrate, or silicon on insulator (SOI), but is not limited thereto. Also, the substrate 300 includes a first region 100 and a second region 200.

Figure 1:
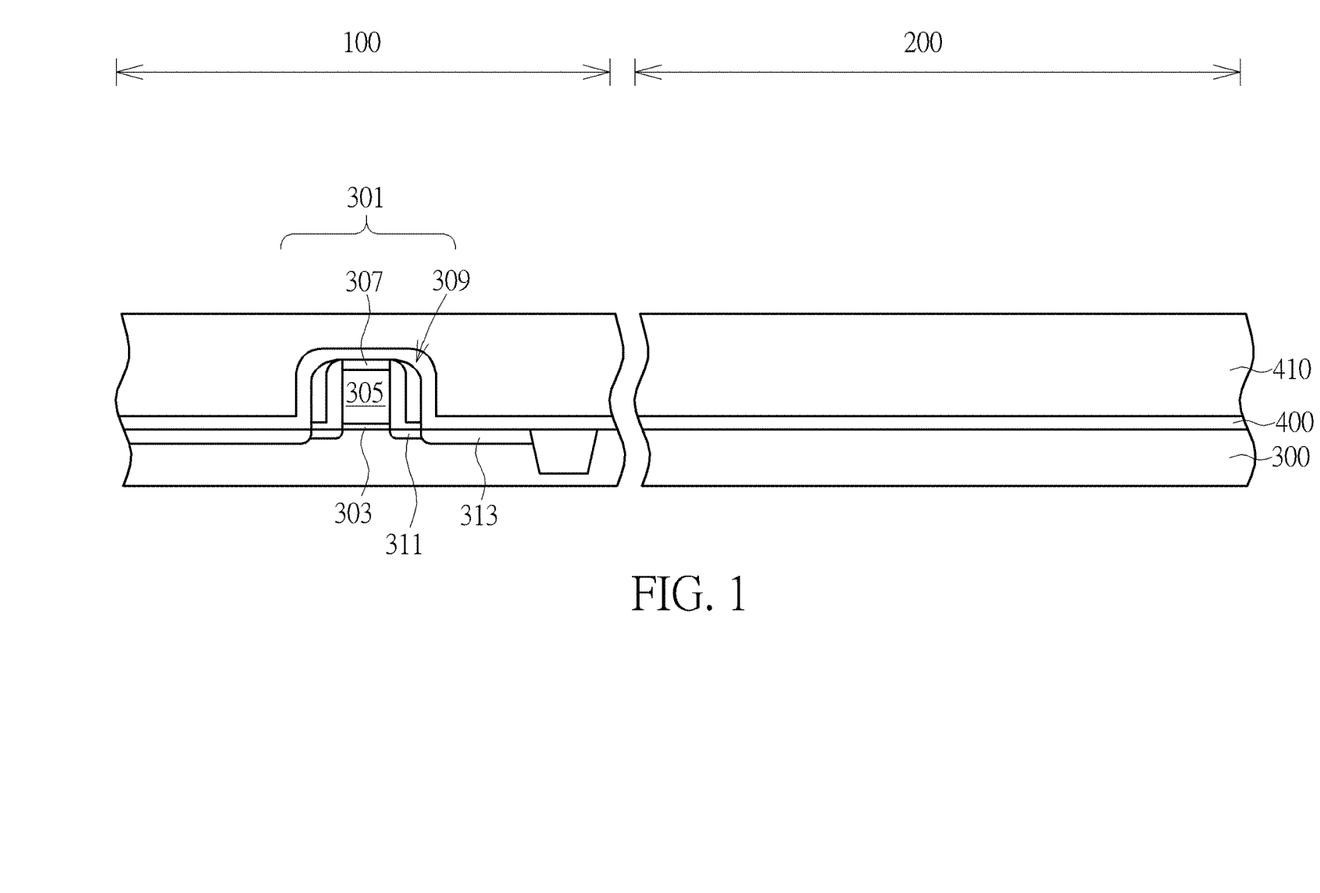
FIG. 1 is a schematic diagram showing a semiconductor device at the beginning of the forming method.

At least one transistor 301 is formed on the substrate 300, and a contact etch stop layer (CESL) 400 and an interlayer dielectric (ILD) layer 410 are formed on the substrate 300, to cover the transistor 301 and the substrate 300. Precisely, the transistor 301 is formed in the first region 100 of the substrate 300, and includes a gate dielectric layer 303, a gate electrode 305, a capping layer 307 a spacer 309, two light doped drain regions 311 and two source/drain regions 313. In one embodiment, the gate dielectric layer 303 may include silicon oxide or high dielectric constant (high-k) dielectric material (greater than 4). The gate electrode 305 may include polysilicon or metal, but is not limited thereto. The capping layer 307 may include silicon nitride (SiN). The spacer 309 is a monolayer structure or a multilayer structure optionally, for example including high temperature oxide (HTO), SiN, silicon oxide or SiN formed by hexachlorodisilane ($Si_2Cl_6$) (HCD-SiN), as shown in FIG. 1.

In the present embodiment, the transistor 301 may include any active component, like complementary metal oxide semiconductor (CMOS) or photo-diode for example, and the forming method may include following steps. First of all, a gate dielectric material layer (not shown in the drawings), a gate material layer (not shown in the drawings) and a capping material layer (not shown in the drawings) are sequentially stacked on the substrate 300, and then the stacked layers are patterned to form the capping layer 309, the gate electrode 305 and the gate dielectric layer 303. Then, the light doped drain regions 311, the spacer 309, and the source/drain regions 313 are formed at two sides of the gate electrode 305. However, people in the art shall easily realize that the formation of the transistor 301 may also include other process, which may be well known by one skilled in the art. For example, in one embodiment of the present invention, after the transistor 301 shown in FIG. 1 is formed, a selective epitaxial growth (SEG) process and/or replacement metal gate (RMG) process is optionally performed, and the detailed steps thereof may be similar to general processes of forming a transistor and will not be redundantly described herein.

Next, a metal interconnection system is formed in the first region 100 of the substrate 300. In the present embodiment, contact plugs 401 directly electrically connected to the source/drain regions 313 and contact plugs 411 electrically connected to the contact plugs 401 are formed sequentially. The contact plugs 401 are disposed through an interlayer dielectric layer 410, like a low dielectric constant (low-k) dielectric layer for example, to directly contact the source/drain regions 313, and the contact plugs 411 are disposed sequentially through a dielectric layer 430 on the interlayer dielectric layer 410, such as a low-k dielectric layer, and a hydrogen blocking layer 420, to directly contact the contact plugs 401.

Figure 2:
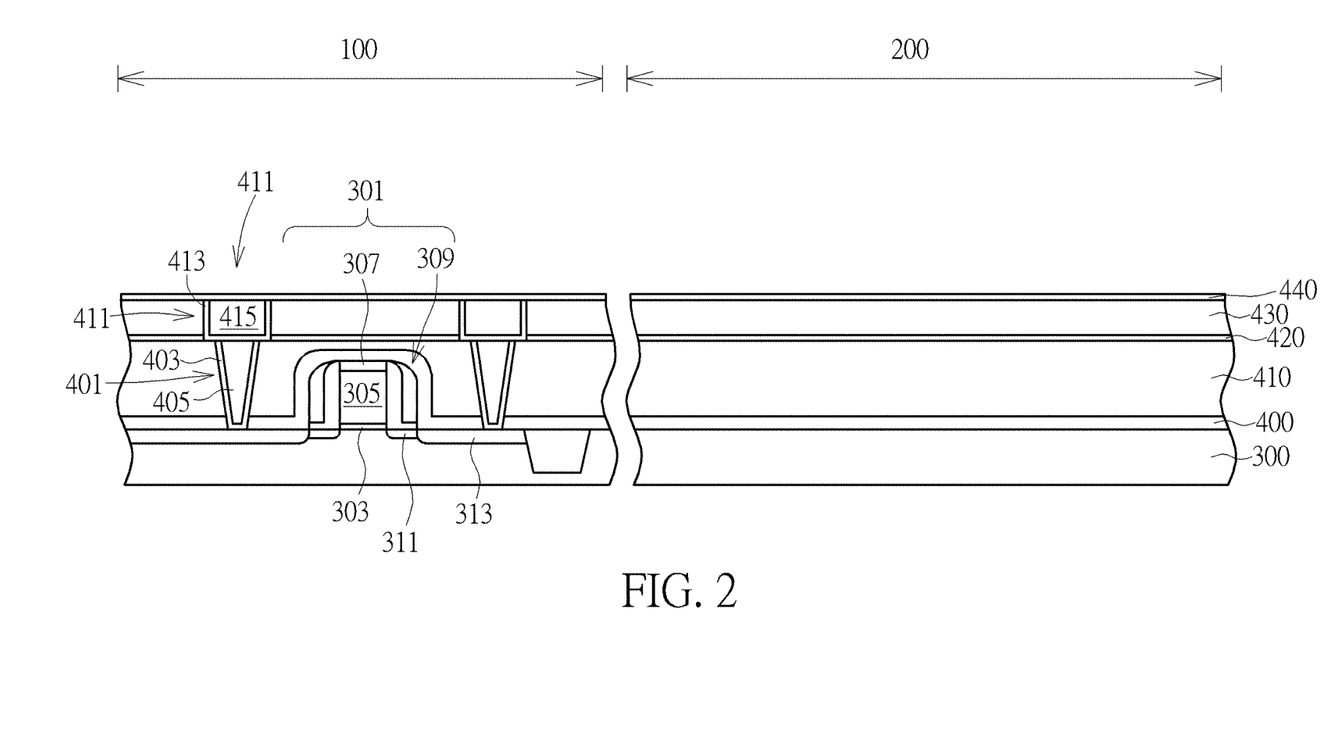
FIG. 2 is a schematic diagram showing a semiconductor device after forming a contact plug.

Precisely, each of the contact plugs 401 may include a barrier layer 403, like a titanium/titanium nitride layer for example, disposed peripherally and a metal layer 405, like tungsten for example, disposed internally but is not limited thereto. In one embodiment, slot patterns (not shown in the drawings) of the contact plugs 401 may be respectively defined through a double patterning lithography, but is not limited thereto. It is worth noting that, in the present embodiment, after forming the contact plugs 401, the hydrogen blocking layer 420 may be formed to entirely cover the contact plugs 401, as shown in FIG. 2. With such performance, the hydrogen blocking layer 420 may block out-diffusion mist and hydrogen in the device, so as to avoid such out-diffusion mist and hydrogen flowing along the metal interconnect structure and affecting the device or the subsequent forming processes. In one embodiment, the hydrogen blocking layer 420 may include silicon oxynitride (SiON) or a high-k dielectric material, such as a metal oxide layer, preferably an earth metal oxide layer, like hafnium oxide (HfOx), hafnium silicon oxide ($HfSiO_4$), hafnium silicon oxynitride (HfSiON), aluminum oxide ($Al_2O_3$), lanthanum oxide ($La_2O_3$) or hafnium zirconium oxide (HfZrO), but is not limited thereto.

On the other hand, the contact plugs 411 may include a barrier layer, like a titanium/titanium nitride layer for example, disposed peripherally and a metal layer 415, like tungsten for example, disposed internally but is not limited thereto. In the present embodiment, a hydrogen blocking layer 440 may be also formed after the contact plugs 411 are formed, to entirely cover the contact plugs 411, as shown in FIG. 2. In this manner, the hydrogen blocking layer 440 may block out-diffusion mist and hydrogen in the device, so as to avoid such out-diffusion mist and hydrogen flowing along the metal interconnect structure and affecting the device or the subsequent forming processes. Please note that, detailed forming processes and materials of the hydrogen blocking layer 440 are substantially similar to those of the aforementioned hydrogen blocking layer 420, and will not be redundantly described herein.

Figure 3:
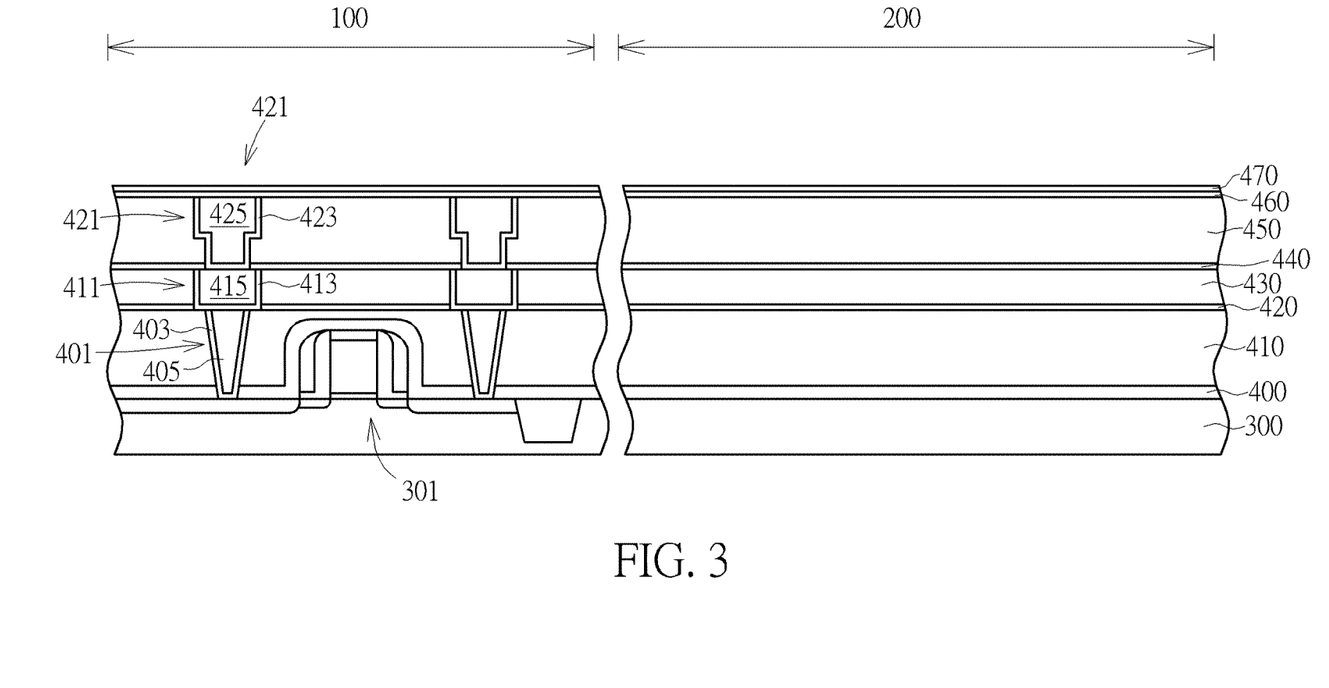
FIG. 3 is a schematic diagram showing a semiconductor device after forming a damascene structure.

Next, at least one damascene structure 421 is formed to electrically connect the contact plugs 411. In one embodiment, the damascene structure 421, like a via-first damascene structure for example, is formed in an interlayer dielectric layer 450 (for example a low-k dielectric layer), as shown in FIG. 3. The formation of the damascene structure 421 may include following steps. Firstly, a via opening (not shown in the drawings) may be defined in the interlayer dielectric layer 450 through a patterned mask layer (not shown in the drawings), and a trench (not shown in the drawings) is then defined also in the interlayer dielectric layer 450. Thus, the damascene structure 421 may simultaneously form in the via opening and the trench, and which includes a plug (not shown in the drawings) and a metal wire (not shown in the drawings). The damascene structure 421 may also include a barrier layer 423, like a titanium/titanium nitride layer for example, disposed peripherally and a metal layer 425, like tungsten for example, disposed internally, but is not limited thereto. However, people in the art shall easily realize that the damascene structure of the present invention may not be limited to the aforementioned, and in another embodiment, the damascene structure may also be formed through other processes which may be well known in the art, such as a self-aligned damascene process, or a trench-first damascene structure (not shown in the drawings) may also be formed.

It is noted that, since copper has diffusion property, a capping layer 460, like a silicon oxide layer, silicon nitride layer, a silicon oxynitride (SiON) layer, or a silicon carbonitride (SiCN) layer for example, is firstly formed after the damascene structure 421 is formed, for the sake of preventing copper from diffusing into periphery dielectric layer. Then, a hydrogen blocking layer 470 may be formed, and which may also include silicon oxynitride (SiON) or a high-k dielectric layer, like a metal oxide layer for example, preferably an earth metal oxide layer, like hafnium oxide (HfOx), hafnium silicon oxide ($HfSiO_4$), hafnium silicon oxynitride (HfSiON), aluminum oxide ($Al_2O_3$), lanthanum oxide ($La_2O_3$) or hafnium zirconium oxide (HfZrO). In this way, copper diffusion and out-diffusion mist and hydrogen may be blocked respectively by the capping layer 460 and the hydrogen blocking layer 470. Also, in another embodiment of the present invention (not shown in the drawings), the metal layer of the damascene structure 421 may also include other metal, such as tungsten, such that, the capping layer 460 may be omitted accordingly and only the hydrogen blocking layer 470 is formed on the damascene structure 421.

Figure 4:
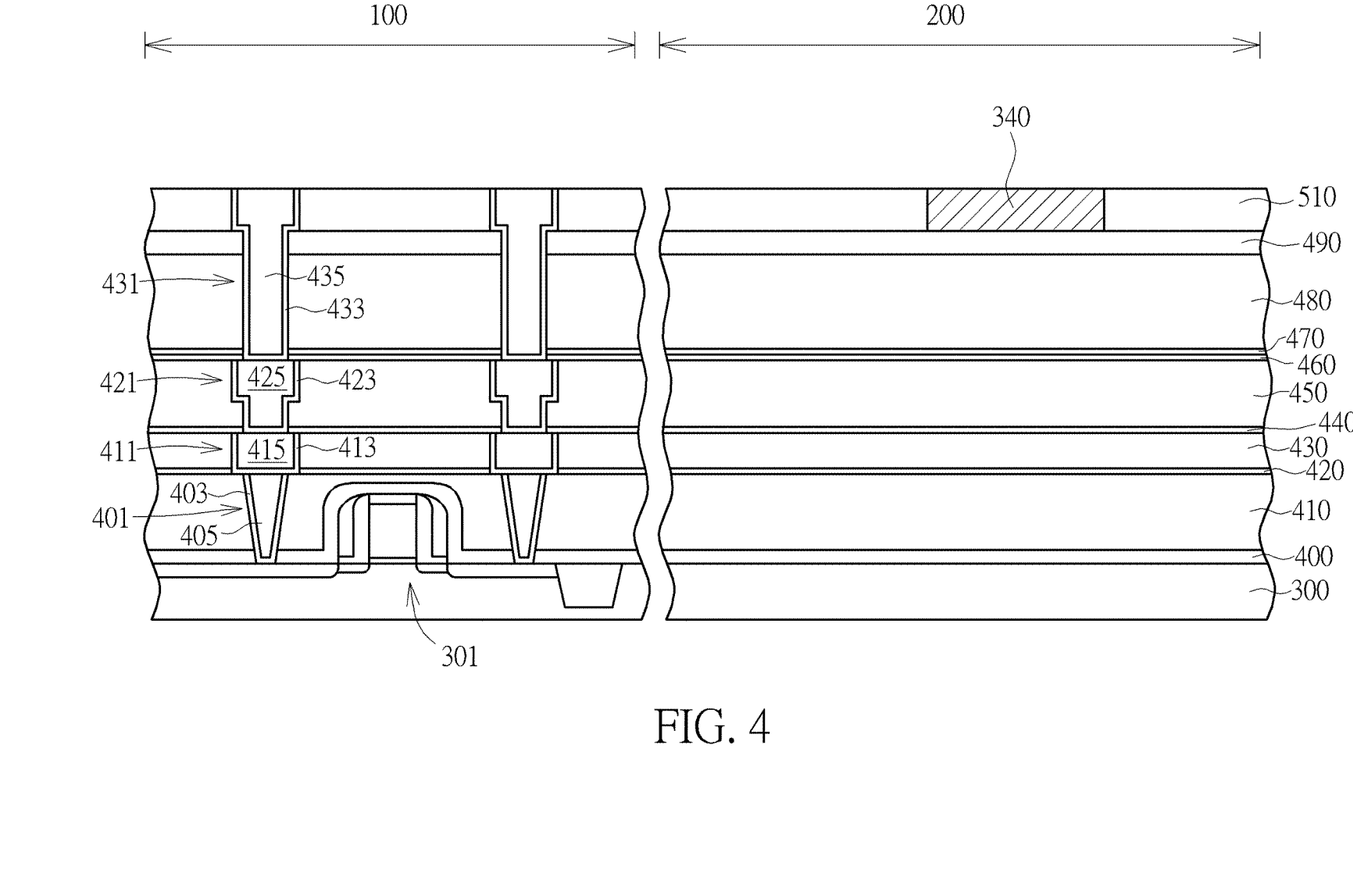
FIG. 4 is a schematic diagram showing a semiconductor device after forming another damascene structure.
Figure 5:
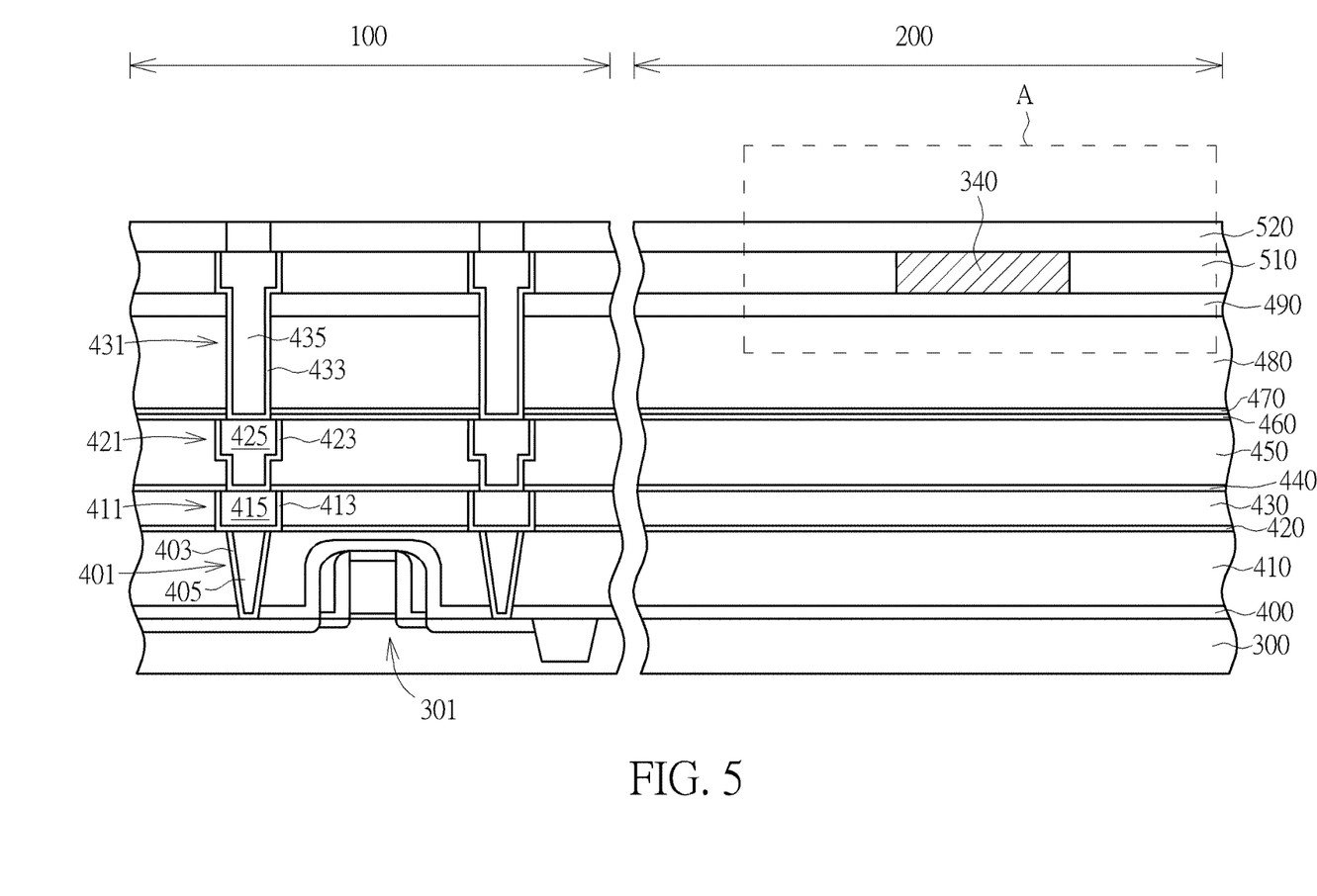
FIG. 5 is a schematic diagram showing a semiconductor device after forming an oxide semiconductor structure.

Following these, a damascene structure 341 disposed in interlayer dielectric layers 510, 480 may be formed, and which includes a barrier layer 433, like a titanium/titanium nitride layer for example, and a metal layer 435, like copper for example, as shown in FIG. 4. In one embodiment, the formation of the damascene structure 431 for example includes firstly defining a via opening (not shown in the drawings) in the interlayer dielectric layer 510 and a stop layer 490, further defining a trench (not shown in the drawings) in the interlayer dielectric layer 510 by using the stop layer 490 as an etching stop layer, and finally forming the damascene structure 431 in the via opening and the trench, wherein the damascene structure 431 is also consisted of a plug (not shown in the drawings) and a metal wire (not shown in the drawings).

Through the aforementioned process, the contact plugs 401, 411 and damascene structures 421, 431 sequentially formed in the first region 100 of the substrate 300, and the metal interconnection structure are formed thereby, so that, the metal interconnection structure may electrically connect to the transistor 301, for receiving or delivering any input/output signals from the transistor 301.

The forming method of the present embodiment for example is characterized by forming the hydrogen blocking layer on the plug structures and the damascene structures, after each of the plug structures and the damascene structures is formed. The hydrogen blocking layer may include silicon oxynitride or earth metal oxide, like hafnium oxide (HfOx), hafnium silicon oxide ($HfSiO_4$), hafnium silicon oxynitride (HfSiON), aluminum oxide ($Al_2O_3$), lanthanum oxide ($La_2O_3$) or hafnium zirconium oxide (HfZrO), such that, the hydrogen blocking layer may effectively block out-diffusion mist and hydrogen in the device, so as to avoid such out-diffusion mist and hydrogen flowing along the metal interconnect structure and affecting the device or the subsequent forming processes. It is noted that, if the plug structures or the damascene structures include a copper layer, an additional capping layer, like silicon oxide, silicon oxynitride or silicon carbonitride for example, may be formed before the hydrogen blocking layer is formed, for further preventing copper from diffusing into periphery dielectric layer and improving the reliability of the device thereby.

On the other hand, while the metal interconnect structure is formed in the first region 100, an oxide semiconductor structure may be optionally formed in the second region 200. For example, a conductive layer, which includes the same metal material (such as copper) to that of the metal layers 415, 425, 435 of the contact plugs 411 and the damascene structures 421, 431, may be simultaneously formed in the interlayer dielectric layer 430 or other interlayer dielectric layers in the second region 200, to function like a back gate electrode 340 of a dual gate structure, as shown in FIG. 4.

Then, an insulating layer 520 may be formed on the interlayer dielectric layer 520, wherein the insulating layer 520 may include a monolayer structure or a multilayer structure and the material thereof may include general low-k dielectric material, like silicon oxide for example, or high-k dielectric material, like metal oxide, preferably an earth metal oxide, like hafnium oxide, but is not limited thereto. Next, please refer FIGS. 6-10. In order to illustrate the present invention conveniently, FIGS. 6-10 illustrate the enlarged region A shown in FIG. 5.

In addition, an oxide semiconductor (OS) material layer 306 and a conductive material layer 310 are formed on the insulating layer 520. The OS material layer 306 may be a single layer or have a multilayered structure, wherein each may contain the same or different materials, e.g., indium gallium zinc oxide (InGaZnO), $InGaO_2$, $InZnO_2$, ZnInO or GaZnO. Preferably, it contains C-axis aligned crystal InGaZn (CAAC-InGaZnO), such that, the OS material layer 306 may exhibit high carrier mobility and low leakage current to serve as a channel layer of the bottom gate electrode 340. It is understood for one skilled in the art that the OS material layer in the present invention may have other material or may have multi-layers, wherein each layer has the same or different material, which is not limited to the above embodiment.

Figure 6:
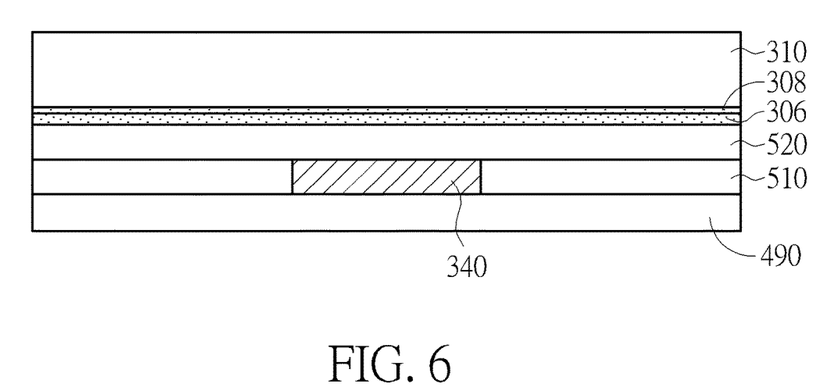
FIG. 6 is a schematic diagram showing an enlarged view of the semiconductor device in FIG. 5 after forming an oxide semiconductor material layer.

In one embodiment, an insulating layer 308 may further be formed on the OS material layer 306, as shown in FIG. 6. It is worth noting that the insulating layer 308 is preferably composed of an oxide semiconductor (OS) material, such as InGaZnO, $InGaO_2$, $InZnO_2$ or ZnInO or GaZnO, and is not limited thereto. Preferably, the material of the OS material in the insulating layer 308 is different than that of the OS material layer 306, and a thickness of the insulating layer 308 is less than that of the OS material layer 306, but is not limited thereto. By doing this, the insulating layer 308 may serve as a barrier layer.

Figure 7:
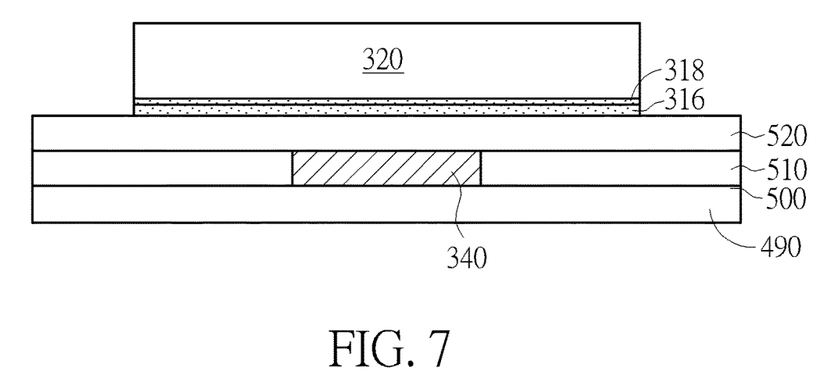
FIG. 7 is a schematic diagram showing an enlarged view of the semiconductor device in FIG. 5 after performing a patterning process.

Next, the OS material layer 306 and the conductive material layer 310 are patterned to form an OS layer 316 and a patterned conductive layer 320. The patterning process may be carried out by one single photo-etching-process (PEP) or a plurality of PEPs. In the embodiment of forming the insulating layer 308, the OS material layer 306, the insulating layer 308 and the conductive material layer 310 may be patterned simultaneously wherein the insulating layer 520 is used as an etch stop layer. Accordingly, the sidewall of the OS layer 316, the sidewall of the patterned insulating layer 318 and the sidewall of the patterned conductive layer 320 are vertically aligned with each other, as shown in FIG. 7. It is noted that the OS layer 316 is disposed correspondingly to the bottom gate electrode 340, preferably, a projection of the bottom gate electrode 340 along a vertical direction of the substrate 300 is disposed at a center of the OS layer 316, as shown in FIG. 7.

Figure 8:
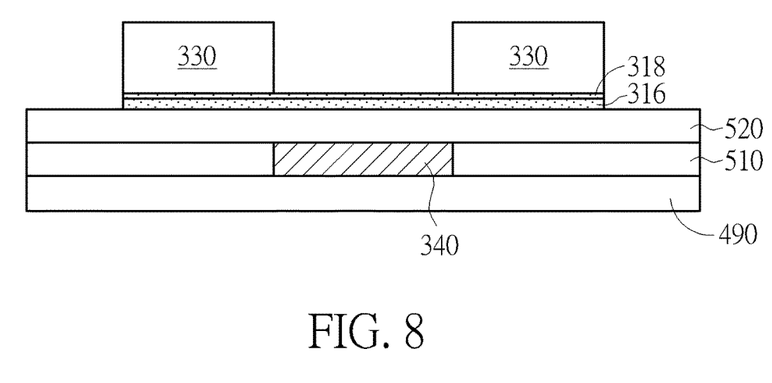
FIG. 8 is a schematic diagram showing an enlarged view of the semiconductor device in FIG. 5 after performing another patterning process.

Then, the patterned conductive layer 320 is patterned again by using the insulating layer 318 and the OS layer 316 as etch stop layers, to form two separate parts, preferably two source/drain structures (S/D region) 330 with the same width, wherein a part of the OS layer 316 or the insulating layer 318 is exposed by the two S/D regions 330 (FIG. 8 only illustrates the embodiment of exposing the insulating layer 318). On the other hand, as described above, the outer sidewalls of the S/D region 330 are vertically aligned with the sidewall of the OS layer 316 and the sidewalls of the insulating layer 318. Also, in one embodiment of the present invention, the patterning process may be carried out by one single PEP or a plurality of PEPs, but is not limited thereto.

Thereafter, a high-k dielectric layer 324 is formed comprehensively on the substrate 300 and the S/D regions 330, in which it may be one single layer or have a multi-layered structure. Preferably, the high-k dielectric layer may include metal oxide, preferably earth metal oxide, like hafnium oxide, hafnium silicon oxide, hafnium silicon oxynitride, aluminum oxide, lanthanum oxide or hafnium zirconium oxide for example, but is not limited thereto. After that, a dielectric material 326 and a gate material layer 328 are conformally formed on the substrate 300. In one embodiment, the dielectric material layer 326 preferably includes a low-dielectric material, such as $SiO_2$, or a high-k dielectric material; and the gate material layer 328 may include any conductive material, such as metal, like aluminum (Al), molybdenum (Mo), titanium (Ti), tantalum (Ta), cadmium (Cd), a nitride thereof, an oxide thereof, alloys thereof, or a combination thereof.

Figure 9:
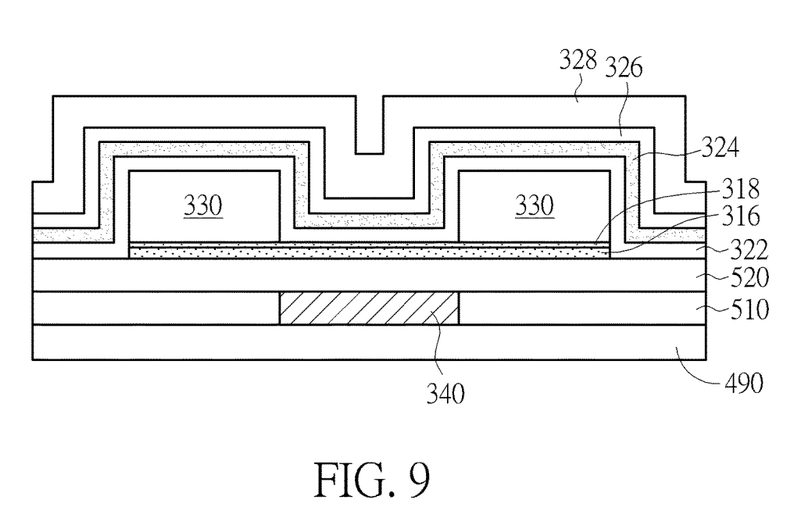
FIG. 9 is a schematic diagram showing an enlarged view of the semiconductor device in FIG. 5 after forming a high-k dielectric layer, a dielectric material layer and a gate material layer.

However, in one embodiment, after forming the high-k dielectric layer 324, an oxygen ambience treatment (not shown in the drawings) is performed on the high-k dielectric layer 324, wherein the oxygen ambience treatment may include an annealing process, a plasma treatment or a chemical solution process. With such oxygen ambience treatment, the oxygen atom in the high-k dielectric layer 324 may be released, and the high-k dielectric layer 324 can be tuned by the oxygen ambience treatment, so as to avoid the oxygen vacancy phenomenon. In another embodiment, another insulating layer 322 may be optionally formed, between the source/drain structures 330 and the high-k dielectric layer 324, as shown in FIG. 9. The insulating layer 322 is preferably composed of an oxide semiconductor (OS) material, such as InGaZnO, $InGaO_2$, $InZnO_2$ or ZnInO or GaZnO, and is not limited thereto. Preferably, the material of the OS material in the insulating layer 322 is different than that of the OS layer 316, and a thickness of the insulating layer 322 is less than that of the OS layer 316, but is not limited thereto. By doing this, the insulating layer 322 may directly contact the source/drain structures 330 and the exposed insulating layer 318 to serve as a barrier layer, for protecting the patterned sidewalls of the source/drain structures (also known as S/D regions) 330 and the exposed insulating layer 318. Also, in the embodiments without the insulating layer 318, the insulating layer 322 may directly contact the S/D regions 330 and the exposed OS layer 316.

Figure 10:
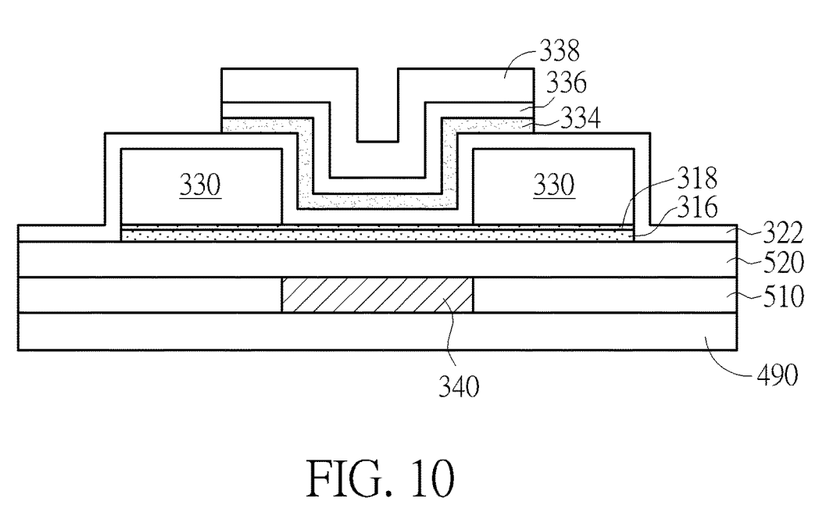
FIG. 10 is a schematic diagram showing an enlarged view of the semiconductor device in FIG. 5 after patterning the high-k dielectric layer, the dielectric material layer and the gate material layer.

Following these, the gate material layer 328, the dielectric material layer 326 and the high-k dielectric layer 324 are patterned simultaneously to form a top gate electrode 338, a gate dielectric layer 336 and a patterned high-k dielectric layer 334 respectively. It is noted that the sidewall of the top gate electrode layer 336, the sidewall of the gate dielectric layer and the sidewalls of the patterned high-k dielectric layer 334 are vertically aligned with each other. Also, in the embodiment of forming the insulating layer 322, the insulating layer 322 may be also patterned optionally, or may be used as an etch stop layer while the patterning process is performed, as shown in FIG. 10.

According to the above description, the semiconductor device according to the first embodiment of the present invention is provided. In the subsequent processes, a plug process may be optionally performed, to further form at least one plug 338 (not shown in the drawings) to electrically connect to the source/drain structures 330 and/or the top gate electrode 338, but is not limited thereto. As shown in FIG. 10, the semiconductor device includes the substrate 300, the metal interconnect structure disposed in the first region 100 of the substrate 300, and the oxide semiconductor structure disposed in the second region 200 of the substrate 300. The metal interconnect structure includes the contact plugs 401, 411 and the damascene structures 421, 431. Also, the oxide semiconductor structure may include the back gate electrode 340 disposed below the insulating layer 520 and the top gate electrode 338 disposed on the insulating layer 520.

People skilled in the art shall easily realize that the semiconductor device of the present invention is not limited to being formed through the aforementioned steps, and may include other forming methods. Thus, the following description will detail other different embodiments or variant embodiments of the manufacturing method of the semiconductor device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 11:
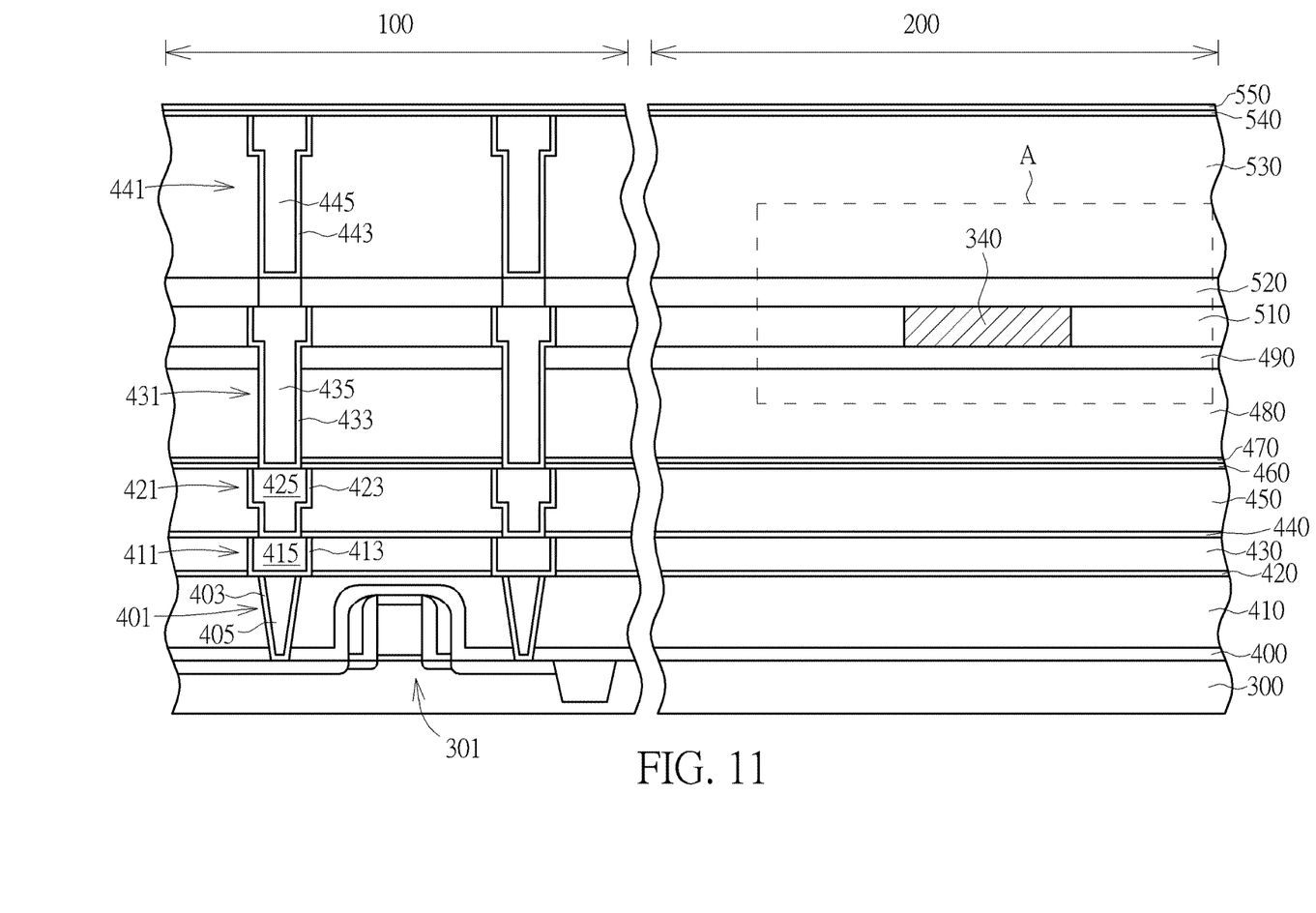
FIG. 11 is a schematic diagram illustrating a method of forming a semiconductor device according to a second embodiment of the present invention.

Please refer to FIG. 11, which is a schematic diagram illustrating a method of forming a semiconductor device according to the second embodiment of the present invention. The formal steps in the present embodiment are substantially similar to FIGS. 1-10 shown in the aforementioned first embodiment, including sequentially forming the substrate 300, at least one transistor 301, the metal interconnect structure disposed in the first region 100 of the substrate 300 and the oxide semiconductor structure disposed in the second region 200 of the substrate 300. The differences between the present embodiment and the aforementioned first embodiment are that, after forming the structure shown in FIG. 5, a dielectric layer 530 may be formed additionally, and a plug structure, such as a damascene structure 441, may be formed in the dielectric layer 530, as shown in FIG. 11. The damascene structure 441 includes a barrier layer 443, such as Ti/TiN and a metal layer 443, such as copper. Precisely speaking the damascene structure 441 for example also includes a trench-first damascene structure, and consists of a plug (not shown in the drawings) and a metal wire (not shown in the drawings). The formation and the detailed materials of the damascene structure 441 are substantially similar to those of the damascene structure 421 in the aforementioned first embodiment or are well known in the art, and will not be redundantly described herein. Then a capping layer 540 and the hydrogen blocking layer 550 are sequentially formed, to block the copper diffusion and the out diffusion mist and hydrogen in the device respectively.

Please note that, the detailed forming methods and materials of the capping layer 540 and the hydrogen blocking layer 550 in the present embodiment may be substantially similar to those of the capping layer 460 and the hydrogen blocking layer 470 in the aforementioned first embodiment or are well known in the art, and may not be redundantly described herein.

According to the above description, the semiconductor device according to the second embodiment of the present invention is provided. In other words, the present invention further forms a plug structure, and a hydrogen blocking layer disposed thereon, after forming the metal interconnect structure and the oxide semiconductor structure respectively in two different regions of the substrate. It is noted that, the hydrogen blocking layer in the present embodiment may also be formed on the plug structure disposed over the oxide semiconductor structure, such that, the mist and hydrogen diffused in the device may be further sufficiently blocked, so as to avoid such out-diffusion mist and hydrogen flowing along the metal interconnect structure and affecting the oxide semiconductor device in the subsequent forming processes.

Figure 12:
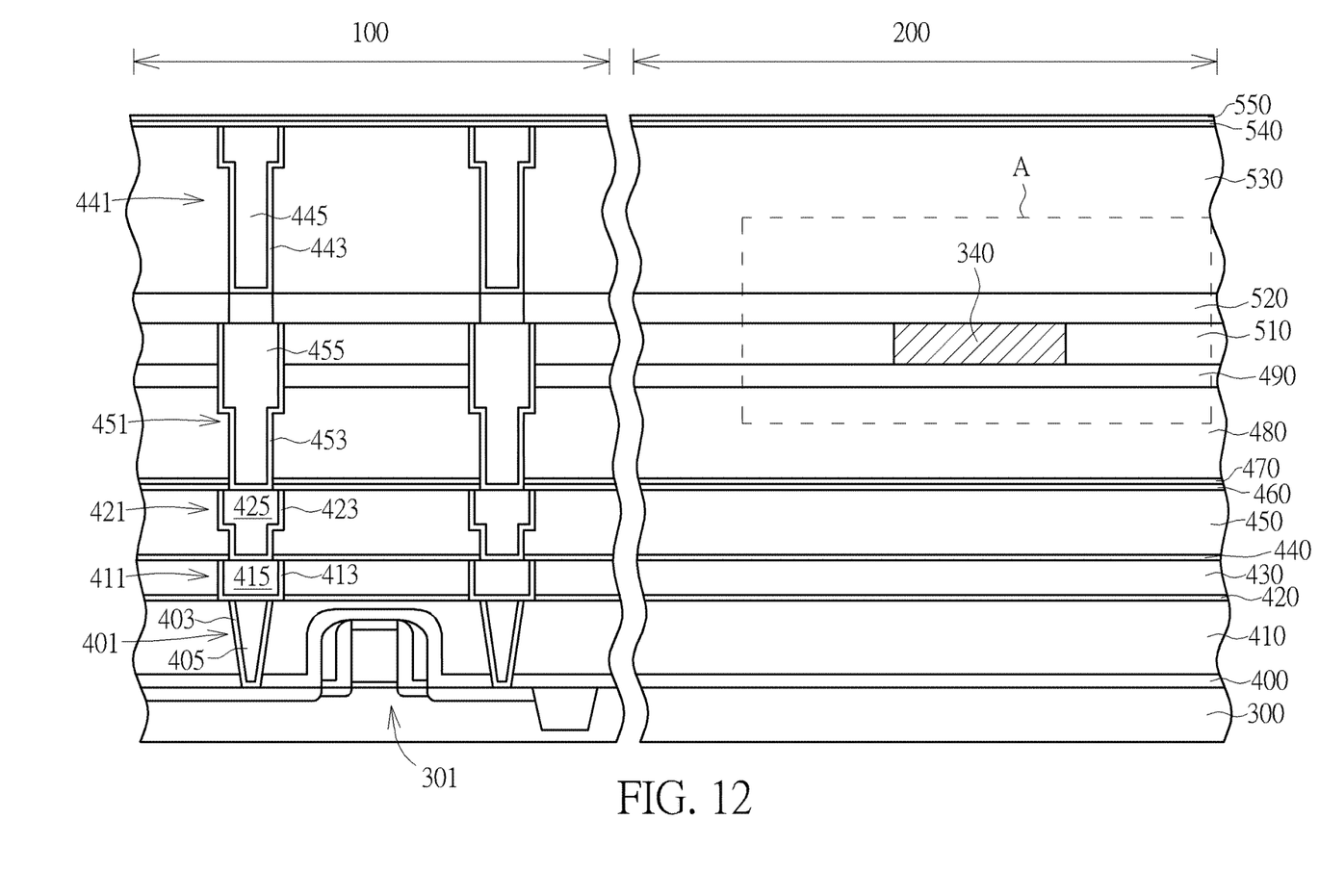
FIG. 12 is a schematic diagram illustrating a method of forming a semiconductor device according to a third embodiment of the present invention.

Please refer to FIG. 12, which is a schematic diagram illustrating a method of forming a semiconductor device according to the third embodiment of the present invention. The formal steps in the present embodiment are substantially similar to FIGS. 1-11 shown in the aforementioned second embodiment, and the differences between the present embodiment and the aforementioned second embodiment are that, after forming the structure shown in FIG. 3, a damascene structure 451 shown in FIG. 12 may be formed in the dielectric layers 480, 510. The damascene structure 451 includes a barrier layer 453, such as Ti/TiN and a metal layer 453, such as copper. Precisely speaking, the formation of the damascene structure 451 may include following steps. Firstly, a via opening (not shown in the drawings) may be defined in the interlayer dielectric layer 480 through a patterned mask layer (not shown in the drawings), and a trench (not shown in the drawings) is then defined in the interlayer dielectric layer 510 to penetrate through the stop layer 490 and a portion of the interlayer dielectric layer 480. Thus, the damascene structure 451 may simultaneously form in the via opening and the trench, and which includes a plug (not shown in the drawings) and a metal wire (not shown in the drawings). The damascene structure 451 may also include a barrier layer 453, like a titanium/titanium nitride layer for example, and a metal layer 455, like tungsten, as shown in FIG. 12. Except for the aforementioned difference, other forming processes and materials are all similar to those in the second embodiment or are well known in the art, and will not be redundantly described herein.

In summary, the present invention provides a semiconductor device, in which the hydrogen blocking layer, like hafnium oxide, hafnium silicon oxide, hafnium silicon oxynitride, aluminum oxide, lanthanum oxide or hafnium zirconium oxide for example, may be further formed on each plug structure and damascene structure, after those plug structures and damascene structures are formed. In other words, the present invention disposes a multilayer structure of hydrogen blocking layers (including oxide metal) in the metal interconnect structure either between a metal oxide semiconductor (MOS) transistor and an oxide semiconductor (OS) structure, or above the OS structure. With such arrangement of the hydrogen blocking layer to block out-diffusion mist and hydrogen in the device, this can avoid such out-diffusion mist and hydrogen flowing along the metal interconnect structure and avoid affecting the device or the subsequent forming processes. Also, if the plug structure or the damascene structure includes a copper layer, an additional capping layer, like a silicon oxide layer, silicon nitride layer, a silicon oxynitride layer, or a silicon carbonitride layer for example, may be further disposed before the hydrogen blocking layer is formed, to further prevent copper from diffusing into periphery dielectric layer and to further improve the reliability of the device thereby.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
  a substrate having a first region and a second region;
  an interconnect structure, disposed on the substrate, in the first region, wherein the interconnect structure comprises:
    a plug disposed in a dielectric layer on the substrate;
    a hydrogen blocking layer disposed on the plug; and
    a capping layer disposed between the hydrogen blocking layer and the plug; and
  an oxide semiconductor structure disposed over the hydrogen blocking layer, in the second region of the substrate, wherein the oxide semiconductor structure comprises:
    an oxide semiconductor layer disposed on a first insulating layer;
    two source/drain structures disposed on the oxide semiconductor layer; and
    a first gate disposed between the source/drain structures, on the oxide semiconductor layer, wherein the first gate overlaps the oxide semiconductor layer.
2. The semiconductor device of claim 1, wherein the hydrogen blocking layer comprises a high dielectric constant (high-k) material.
3. The semiconductor device of claim 1, wherein the hydrogen blocking layer comprises a metal oxide material.
4. The semiconductor device of claim 1, wherein the high-k material comprises $HfO_2$ or $AlO_2$.
5. The semiconductor device of claim 1, wherein the plug comprises copper or tungsten.
6. The semiconductor device of claim 1, wherein the capping layer comprises at least one of SiN, SiCN, or SiON.
7. The semiconductor device of claim 1, further comprising:
  a second insulating layer disposed between the oxide semiconductor layer and the source/drain structures, wherein the second insulating layer comprises a oxide semiconductor material different from the oxide semiconductor layer.
8. The semiconductor device of claim 7, wherein the second insulating layer has a thickness being smaller than that of the oxide semiconductor layer.
9. The semiconductor device of claim 1, wherein the oxide semiconductor structure further comprises a second gate electrode disposed below the oxide semiconductor layer, and the second gate electrode overlaps the oxide semiconductor layer.
10. The semiconductor device of claim 9, wherein the oxide semiconductor structure further comprises:
  another hydrogen blocking layer, disposed over the oxide semiconductor structure, the another hydrogen blocking layer including $HfO_2$.

11. The semiconductor device of claim 1, wherein the oxide semiconductor layer comprises a monolayer structure or a multilayer structure.

12. The semiconductor device of claim 1, further comprising:
a high dielectric constant (high-k) dielectric layer, disposed between the first gate electrode and the source/drain structures.

13. A semiconductor device, comprising:
a low dielectric constant (low-k) dielectric layer, disposed on a substrate;
a metal layer disposed in the low-k dielectric layer;
a hydrogen blocking layer, covered on the low-k layer; and
a capping layer disposed between the hydrogen blocking layer and the metal layer, wherein the capping layer comprises at least one of SiN, SiCN or SiON.

14. A method of forming a semiconductor device, comprising:
providing a substrate having a first region and a second region;
forming an interconnect structure on the substrate, in the first region, wherein the interconnect structure comprises:
a plug disposed in a dielectric layer on the substrate;
a hydrogen blocking layer disposed on the plug; and
a capping layer disposed between the hydrogen blocking layer and the plug, wherein the capping layer comprises silicon nitride, silicon carbonitride, or silicon oxynitride; and
forming an oxide semiconductor structure over the hydrogen blocking layer, in the second region, wherein the oxide semiconductor structure comprises:
an oxide semiconductor layer disposed on a first insulating layer;
two source/drain structures disposed on the oxide semiconductor layer; and
a first gate disposed between the source/drain structures, on the oxide semiconductor layer, wherein the first gate overlaps the oxide semiconductor layer.

15. The method of forming a semiconductor device of claim 14, wherein the forming of the oxide semiconductor structure comprises:
forming a second insulating layer between the oxide semiconductor layer and the source/drain structures, and the second insulating layer comprises a oxide semiconductor material different from that of the oxide semiconductor layer.

16. The method of forming a semiconductor device of claim 14, wherein the forming of the oxide semiconductor structure comprises:
forming a second gate electrode below the oxide semiconductor layer, and the second gate electrode overlaps the oxide semiconductor layer.

17. The method of forming a semiconductor device of claim 14, wherein the forming of the oxide semiconductor structure comprises:
forming another high-k dielectric layer covering the source/drain structures, and between the first gate electrode and the source/drain structures.

18. The method of forming a semiconductor device of claim 17, wherein the forming of the oxide semiconductor structure comprises:
forming a third insulating layer covering the source/drain structures, and between the high-k dielectric layer and the source/drain structures.

* * * * *